(12) United States Patent
Toth et al.

(10) Patent No.: US 8,759,421 B2
(45) Date of Patent: Jun. 24, 2014

(54) CONTINUOUS PROCESS FOR PREPARING NANODISPERSIONS USING AN ULTRASONIC FLOW-THROUGH HEAT EXCHANGER

(75) Inventors: Alan Edward John Toth, Burlington (CA); Santiago Faucher, Oakville (CA); Yiliang Wu, Oakville (CA); Marko Saban, Toronto (CA)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 703 days.

(21) Appl. No.: 12/872,240

(22) Filed: Aug. 31, 2010

(65) Prior Publication Data

US 2012/0049163 A1  Mar. 1, 2012

(51) Int. Cl.
  *C08G 59/42*  (2006.01)
(52) U.S. Cl.
  USPC ............ 523/324; 523/335; 523/348; 366/114
(58) Field of Classification Search
  USPC .......................... 523/324, 335, 348; 366/114
  See application file for complete search history.

(56) References Cited

U.S. PATENT DOCUMENTS

| | | | |
|---|---|---|---|
| 6,438,998 | B1 | 8/2002 | Oh et al. |
| 6,803,262 | B2 | 10/2004 | Wu et al. |
| 6,890,868 | B2 | 5/2005 | Wu et al. |
| 7,005,672 | B2 | 2/2006 | Wu et al. |
| 2004/0104386 | A1 | 6/2004 | Wu et al. |
| 2006/0081841 | A1 | 4/2006 | Wu et al. |
| 2008/0102559 | A1 | 5/2008 | Ong et al. |
| 2008/0103286 | A1 | 5/2008 | Ong et al. |
| 2008/0139767 | A1 | 6/2008 | Toth |
| 2009/0032222 | A1 | 2/2009 | Birbara et al. |
| 2009/0288517 | A1 | 11/2009 | Chretien et al. |
| 2009/0301344 | A1 | 12/2009 | Chretien et al. |
| 2010/0059720 | A1 | 3/2010 | Berkei et al. |
| 2010/0093129 | A1 | 4/2010 | Wu et al. |

FOREIGN PATENT DOCUMENTS

| | | |
|---|---|---|
| EP | 0 595 471 A2 | 5/1994 |
| GB | 1008805 A | 11/1965 |
| GB | 2089230 A | 6/1982 |
| GB | 2370004 A | 6/2002 |
| WO | WO 2007/074437 A2 | 7/2007 |
| WO | WO 2008/007992 A2 | 1/2008 |

OTHER PUBLICATIONS

U.S. Patent Application filed Aug. 28, 2009, of Thomas E. Enright et al., entitled "Continuous Reaction Process For Preparing Metallic Nanoparticles," U.S. Appl. No. 12/550,219, not yet published.
U.S. Patent Application filed Aug. 10, 2009, of Yiliang Wu et al., entitled "Semiconductor Composition," U.S. Appl. No. 12/538,501, not yet published.
Abstract of JP 61091263 (A), Takami Hisanori et al., entitled "Preparation of Readily Dispersible Azo Lake Pigment," published May 9, 1986, 1 page.
Abstract of JP 2007031799 (A), Iwaki Kan et al., entitled "Method for Producing Metal Nanoparticle," published Feb. 8, 2007, 1 page.
Abstract of CN 200610165410, Liu Zeng, entitled "A Continuous Industrialized Nano Material Dispersion Device and Method," published Jul. 11, 2007, 1 page.
Abstract of CN 200710023200, Yan Yongsheng, entitled "Method for Synthesizing Nanometer Polymerization Ferric Persulfate Flocculant by Hydrothermal Method," published Nov. 12, 2008, 1 page.
Abstract of CN 200710178925, Dai Hongxing, entitled "Method for Spindle-Shaped and Bar-Shaped La2CuO4 by Using Copper Oxide As Crystal Seed," published Sep. 3, 2008, 1 page.
Abstract of CN 200810010211, Shen Yongfeng, entitled "High-Strength Nano-level Crystal Nickel Material and Method of Manufacturing the Same," published Jul. 16, 2008, 1 page.
Abstract of CN 200810105916, Tang Yuefeng, entitled "Preparation of Fe/carrier Composite Powder," published Jan. 21, 2009, 1 page.
Abstract of Stefanie Machunsky et al., "Design Study of a Continuous Ultrasound Precipitation Reactor," Chemie Ingenieur Technik 2007, 79, No. 3, p. 251.
Sara E. Skrabalak, Ultrasound assisted synthesis of carbon materials, Phys. Chem. Chem. Phys., 2009, 11, pp. 4930-4942.
Falong Jia et al., "A general nonaqueous sonoelectrochemical approach to nanoporous Zn and Ni particles," Powder Technology 176 (2007), pp. 130-136.
T. Banert et al., "Operating parameters of a continuous sono-chemical precipitation reactor," AIChE Spring National Meeting, Conference Proceedings, Orlando, FL, United States, Apr. 23-27, 2006, 8 pages.
United Kingdom Patent Office Communication dated Dec. 28, 2011, for GB Patent application No. GB1114931.7, 4 pages.
Abstract of JP 11228891, Iwasa Yoichi., entitled "Production of Aqueous Dispersion Ink for Ink Jet Recording," published Aug. 24, 1999, 2 pages.
Abstract of CN 100469427, Liu Zheng, entitled "A Continuous Industrialized Nano Material Dispersion Device and Method," published Jul. 27, 2011, 1 page.
Abstract of CN 200984503, Bing Tang, et al., entitled "Device for Generating Ultrafine Grain," published Dec. 5, 2007, 1 page.
Canadian Office Communication dated Nov. 28, 2012, for Canadian Patent Application No. 2,750,375, 2 pages.

*Primary Examiner* — Edward Cain
(74) *Attorney, Agent, or Firm* — Harness, Dickey & Pierce

(57) ABSTRACT

Described is a continuous process for preparing nanodispersions including providing a composition comprising a liquid and a solute; heating the composition to dissolution of the solute to form a solution comprising the solute dissolved in the liquid; directing the heated solution through a continuous tube wherein the continuous tube has a first end for receiving the solution, a continuous flow-through passageway disposed in an ultrasonic heat exchanger, and a second end for discharging a product stream; treating the heated solution as the solution passes through the continuous flow-through passageway disposed in the ultrasonic heat exchanger to form the product stream comprising nanometer size particles in the liquid; optionally, collecting the product stream in a product receiving vessel; and optionally, filtering the product stream.

11 Claims, 4 Drawing Sheets

CONTINUOUS PROCESS FOR PREPARING NANODISPERSIONS USING AN ULTRASONIC FLOW-THROUGH HEAT EXCHANGER

RELATED APPLICATIONS

Commonly assigned U.S. Patent Application Publication 2008/0139767, U.S. patent application Ser. No. 11/609,651, filed Dec. 12, 2006, which is hereby incorporated by reference herein in its entirety, describes a batch process of producing semi-conductive polymer nanodispersions in which a composition comprising a liquid and a polymer is at least partially dissolved in the liquid, resulting in dissolved polymer molecules in the compositions, wherein the dissolution occurs in a dissolution vessel. The solubility of the dissolved polymer molecules in the composition is then increased to increase the concentration of dissolved polymer in the composition to a range from about 0.1% to about 30% based on a total weight of the polymer and the liquid, wherein increasing the solubility of the dissolved polymer in the composition occurs in a dissolution vessel. The dissolved polymer in the composition is then diluted with a diluent, wherein the dissolution of the dissolved polymer in the composition occurs by addition of the composition to the diluent in a precipitation vessel.

BACKGROUND

Disclosed herein is a continuous process for preparing polymer nanodispersions, in embodiments ink-jettable polymer nanodispersions, comprising providing a polymer solution composition comprising a liquid and a polymer dissolved in the liquid; heating the composition to provide a heated polymer solution; directing the heated polymer solution through a continuous tube wherein the continuous tube has a first end for receiving the polymer solution, a continuous flow-through passageway disposed in an ultrasonic heat exchanger, and a second end for discharging a product stream; treating the heated polymer solution as the solution passes through the continuous flow-through passageway disposed in the ultrasonic heat exchanger to form the product stream containing nanometer size particles in a dispersion; optionally, collecting the product stream in a product receiving vessel; and optionally, filtering the product stream.

Figure 1:
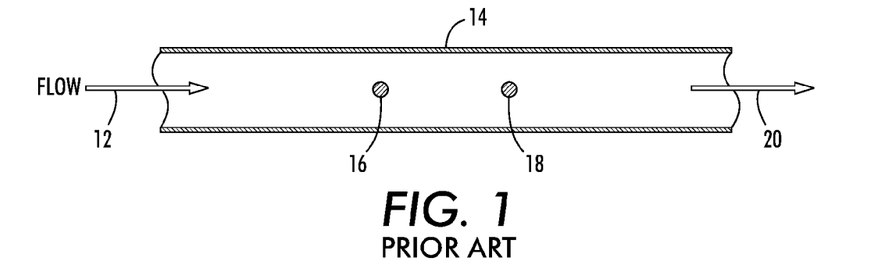
FIG. 1 is an illustration of a previous process for preparing polymer nanodispersion.

Semi-conducting inks are typically made in small laboratory batches, for example in batches of from about 10 to about 200 grams, by heating the polymer solution to dissolution and then immersing the solution in a cool bath under ultrasonication to cool to room temperature, precipitate, and form a dispersion. FIG. 1 illustrates generally a prior art system and process 10 for preparing a polymer nanodispersion comprising flowing a heated stream of polymer solution 12 to be processed through a pipe 14 fitted with ultrasound probes 16, 18. The polymer stream 12 is cooled to room temperature under ultrasonication to precipitate and form a product dispersion stream 20. This process is not scalable and has not been demonstrated beyond 250 grams. The small scale is inadequate to meet current and anticipated quantity needs for semi-conducting materials.

Thin film transistors (TFTs) are fundamental components in modern-age electronics, including, for example, sensors, image scanners, and electronic display devices. TFTs are generally composed of a supporting substrate, three electrically conductive electrodes (gate, source and drain electrodes), a channel semiconducting layer, and an electrically insulating gate dielectric layer separating the gate electrode from the semiconducting layer. It is generally desired to make TFTs which have not only much lower manufacturing costs, but also appealing mechanical properties such as being physically compact, lightweight, and flexible. One approach is through organic thin-film transistors ("OTFT"s), wherein one or more components of the TFT includes organic compounds. In particular, some components can be deposited and patterned using inexpensive, well-understood printing technology. Ink jet printing, such as drop on demand printing, is believed to be a very promising method to fabricate OTFTs. Accordingly, a jettable semiconductor ink is required.

Current processes for preparing semiconductor nanoparticles, in embodiments, polythiophene nanoparticles, such as poly(3,3'''dialkylquaterthiophene) (PQT-12) generally comprise three steps. First, the polymer is dissolved in a suitable solvent, such as dichlorobenzene, at sufficient temperature to ensure complete dissolution. Next, the solution is ultrasonicated by immersion of the dissolution vessel in a room temperature or chilled ultrasonic bath for a suitable period of time, typically about 3 minutes, to precipitate polymer nanoparticles. Finally, the resultant polymer nanodispersion is filtered, such as through a 0.7 micrometer pore size glass fiber filter paper.

It is desirable to prepare polymer nanodispersions in larger than laboratory batch quantities. However, there are challenges to scaling up this process. For example, the limited surface area of batch reactors makes it difficult or impossible to achieve the chill rates required to ensure desired ink quality and high yields at larger scales in a batch process. The reactor volume can be increased. However, as reactor volume increases, the surface area to volume ratio decreases resulting in lower cooling capacities. It may be possible to chill/ultrasonicate a 250 milliliter reactor from dissolution at about 60 to about 70° C. in 2 to 3 minutes or less if chilling can be applied to the bath, and 500 grams may be possible, but volumes of 2 liters and more will cool much more slowly than volumes of 200 milliliters. Because particle size will increase as cooling rate decreases, the particle size of the dispersion will be undesirably larger. When the particle size is too large, the dispersion has lower mobility, less dispersion stability, and becomes difficult or impossible to filter through a 0.7 micrometer filter media thereby affecting consistency of the final concentration of polymer in solution. Dispersions prepared using a cooling rate of 5° C./minute with ultrasonication (which by scale-up standards is very fast) do not produce good dispersions. The particle size is large enough that they cannot be filtered through a 0.7 micrometer pressure filter.

There are inherent limits to the scale of the batch process from an ultrasonication and heat transfer perspective. It is difficult or impossible to locate or build an ultrasound bath of sufficient size with sufficient energy input to hold large reactors. Immersion type ultrasonic generators can be employed, rather than ultrasonic baths. However, immersion type ultrasonic generators produce dispersions with undesirably large particles. Therefore, the scale up of the process is limited in reactor size to that which can fit in a chilled ultrasound bath (typical volumes are less than 2 liters) in order to achieve desired small particle size.

While known compositions and processes are suitable for their intended purposes, a need remains for an improved method for preparing polymer nanodispersions. What is further needed is a process for preparing polymer nanodispersions that can be scaled up to desired volumes. What is further needed is a process that provides faster cooling to yield smaller high mobility particles and that provides stability to the ink dispersion. What is further needed is a process that provides fast cooling rates sufficient to achieve high yields and a cost effective product. What is still further needed is a process wherein ultrasound energy density can be preserved while enabling larger bath sizes not currently available.

The appropriate components and process aspects of the each of the foregoing U.S. Patents and Patent Publications may be selected for the present disclosure in embodiments thereof. Further, throughout this application, various publications, patents, and published patent applications are referred to by an identifying citation. The disclosures of the publications, patents, and published patent applications referenced in this application are hereby incorporated by reference into the present disclosure to more fully describe the state of the art to which this invention pertains.

SUMMARY

Described is a continuous process for preparing nanodispersions comprising providing a composition comprising a liquid and a solute; heating the composition to dissolution of the solute to form a solution comprising the solute dissolved in the liquid; directing the heated solution through a continuous tube wherein the continuous tube has a first end for receiving the solution, a continuous flow-through passageway disposed in an ultrasonic heat exchanger, and a second end for discharging a product stream; treating the heated solution as the solution passes through the continuous flow-through passageway disposed in the ultrasonic heat exchanger to form the product stream comprising nanometer size particles in the liquid; optionally, collecting the product stream in a product receiving vessel; and optionally, filtering the product stream.

Also described is a system for preparing nanodispersions comprising a dissolution vessel containing a composition comprising a liquid and a solute dissolved in the liquid; a heating device for heating the composition to dissolution temperature to form a solution comprising the solute dissolved in the liquid; a continuous tube having a first end for receiving a flow of heated solution from the dissolution vessel, a continuous flow-through passageway disposed in an ultrasonic heat exchanger for flowing a stream of solution through the ultrasonic heat exchanger, and a second end for discharging a product stream; optionally, a device for directing the heated solution through the continuous tube at a controlled rate; an optional product receiving vessel for receiving the product stream; and an optional filtration device for filtering the product stream.

Further described is a semiconducting device comprising a substrate; a gate electrode; a gate dielectric layer; a source electrode; a drain electrode; and in contact with the source and drain electrodes and the gate dielectric layer, a semiconductor layer comprising a polymer nanodispersion; wherein the polymer nanodispersion is prepared by a process comprising providing a polymer solution composition comprising a liquid and a polymer dissolved in the liquid; heating the composition to provide a heated polymer solution; directing the heated polymer solution through a continuous tube wherein the continuous tube has a first end for receiving the polymer solution, a continuous flow-through passageway disposed in an ultrasonic heat exchanger, and a second end for discharging a product stream; treating the heated polymer solution as the solution passes through the continuous flow-through passageway disposed in the ultrasonic heat exchanger to form the product stream comprising nanometer size particles in a dispersion; optionally, collecting the product stream in a product receiving vessel; and optionally, filtering the product stream.

Also described is a method of forming a semiconducting layer of a thin film transistor comprising a) providing a liquid composition comprising a semiconducting material comprising polymer nanodispersion, wherein the polymer nanodispersion is prepared by a process comprising providing a polymer solution composition comprising a liquid and a polymer dissolved in the liquid; heating the composition to provide a heated polymer solution; directing the heated polymer solution through a continuous tube wherein the continuous tube has a first end for receiving the polymer solution, a continuous flow-through passageway disposed in an ultrasonic heat exchanger, and a second end for discharging a product stream; treating the heated polymer solution as the solution passes through the continuous flow-through passageway disposed in the ultrasonic heat exchanger to form the product stream comprising nanometer size particles in a dispersion; optionally, collecting the product stream in a product receiving vessel; and optionally, filtering the product stream; b) applying the liquid composition over a substrate of the transistor; and c) drying the liquid composition to form a semiconducting layer.

DETAILED DESCRIPTION

Described is a continuous process for preparing nanodispersions comprising providing a composition comprising a liquid and a solute; heating the composition to dissolution of the solute to form a solution comprising the solute dissolved in the liquid; directing the heated solution through a continuous tube wherein the continuous tube has a first end for receiving the solution, a continuous flow-through passageway disposed in an ultrasonic heat exchanger, and a second end for discharging a product stream; treating the heated solution as the solution passes through the continuous flow-through passageway disposed in the ultrasonic heat exchanger to form the product stream comprising nanometer size particles in the liquid; optionally, collecting the product stream in a product receiving vessel; and optionally, filtering the product stream. The process herein encompasses dissolution and rapid precipitation of any suitable or desired materials.

In embodiments, the process herein provides a method for dissolution and rapid precipitation of solute wherein small particle size precipitate is desired. For example, in embodiments, wherein the product stream comprises particles having a particle size of from about 1 to about 1,000 nanometers, or from about 10 to about 500 nanometers, or from about 10 to about 300 nanometers.

In certain embodiments, the solute is a small molecule, for example, a small molecule having a molecular weight that is less than about 1,000, and, optionally, is an inorganic salt or pigment.

In embodiments, the solute comprises a conjugated polymer. In specific embodiments, continuous process for preparing ink-jettable polymer nanodispersions using an ultrasonic flow-through heat exchanger is described. The process comprises providing a polymer solution comprising a liquid and a polymer dissolved in the liquid; heating the composition to provide a heated polymer solution; directing the heated polymer solution through a continuous tube wherein the continuous tube has a first end for receiving the polymer solution, a continuous flow-through passageway disposed in an ultrasonic heat exchanger, and a second end for discharging a product stream; treating the heated polymer solution as the solution passes through the continuous flow-through passageway disposed in the ultrasonic heat exchanger to form the product stream comprising nanometer size particles in a dispersion; optionally, collecting the product stream in a product receiving vessel; and optionally, filtering the product stream.

Also described is a system for preparing nanodispersions comprising a dissolution vessel containing a composition comprising a liquid and a solute dissolved in the liquid; a heating device for heating the composition to dissolution temperature to form a solution comprising the solute dissolved in the liquid; a continuous tube having a first end for receiving a flow of heated solution from the dissolution vessel, a continuous flow-through passageway disposed in an ultrasonic heat exchanger for flowing a stream of solution through the ultrasonic heat exchanger, and a second end for discharging a product stream; an optional product receiving vessel for receiving the product stream; and an optional filtration device for filtering the product stream.

In specific embodiments, a system for preparing polymer nanodispersions comprises a dissolution vessel containing a polymer solution comprising a liquid and a polymer dissolved in the liquid; a heating device for heating the composition to provide a heated polymer solution; a continuous tube having a first end for receiving a flow of polymer solution from the dissolution vessel, a continuous flow-through passageway disposed in an ultrasonic heat exchanger for flowing a stream of polymer solution through the ultrasonic heat exchanger, and a second end for discharging a product stream; an optional product receiving vessel for receiving the product stream; and an optional filtration device for filtering the product stream.

In embodiments, the process can be applied to any application that requires nanodispersion. In a specific embodiment, the process can be used to prepare semi-conductor inks. In a more specific embodiment, the process can be used to prepare polythiophene nanoparticles, such as poly(3,3'''-dialkylquaterthiophene) (PQT-12). In embodiments, the process is faster and less expensive than previous processes for preparing polymer nanodispersions.

Any suitable semiconducting polymer nanodispersion material can be prepared with the process described herein. In embodiments, semiconducting materials including thiophene-based polymer, triarylamine-based polymer, polyindolocarbazole, and the like, can be prepared with the present process. Thiophene-based polymer, includes for example, both regioregular and regiorandom poly(3-alkylthiophene)s, thiophene-based polymer comprising substituted and unsubstituted thienylene group, thiophene-based polymer comprising optionally substituted thieno[3,2-b] thiophene and/or optionally substituted thieno[2,3-b] thiophene group, thiophene-based polymer comprising benzothiophene, benzo[1,2-b:4,5-b']dithiophene, benzothieno[3,2-b]benzothiophene, dinaphtho-[2,3-b:2',3'-f] thieno[3,2-b]thiophene and thiophene-based polymer comprising non-thiophene based aromatic groups such as phenylene, fluorene, furan, and the like.

In embodiments, the semiconducting material comprises a compound of the formula

(I)

wherein A is a divalent linkage; $R_1$ and $R_2$ are each independently selected from hydrogen, alkyl, perhaloalkyl, alkoxyalkyl, siloxy-substituted alkyl, polyether, alkoxy, and halogen; and n is an integer from 2 to about 5,000. In some embodiments, $R_1$ and $R_2$ are independently alkyl containing from about 6 to about 30 carbon atoms, or from about 6 to about 20 carbon atoms.

Divalent linkage A can be selected from a compound of the formula and combinations thereof, wherein R' and R" are independently selected from hydrogen, alkyl, substituted alkyl, aryl, substituted aryl, heteroaryl, halogen, such as fluorine, chlorine, and bromine, —CN, or —NO$_2$. Substituents for alkyl and aryl can be any suitable substituent, for example —F, —Cl, —OCH$_3$, and the like. In further embodiments, R' and R" are alkyl or aryl containing from about 6 to about 30 carbon atoms, or from about 6 to about 20 carbon atoms.

In embodiments, the semiconducting material comprises a compound of the formula

(II)

(III)

(IV)

(V)

, and

-continued (VI)

wherein R₁, R₂, R', and R" are independently selected from i) hydrogen, ii) alkyl or substituted alkyl, iii) aryl or substituted aryl, iv) alkoxy or substituted alkoxy, v) a suitable hetero-containing group, vi) a halogen, or mixtures thereof; and n is an integer from about 2 to about 5,000. In embodiments, the semiconducting polymer can be a semiconducting polymer material as described in U.S. Patent Publications 20080102559 and 20080103286, each of which are hereby incorporated by reference herein in their entireties.

In embodiments, $R_1$, $R_2$, R', and R" are independently selected from at least one of hydrogen, a suitable hydrocarbon, a suitable hetero-containing group, and a halogen and where, for example, the hydrocarbon can be alkyl, alkoxy, aryl, substituted derivatives thereof, and the like, inclusive of side-chains containing, for example, from zero to about 35 carbon atoms, or from about 1 to about 30 carbon atoms, or from about 1 to about 20 carbon atoms, or from about 6 to about 18 carbon atoms; and n represents the number of repeating units such as a number of from about 2 to about 5,000, about 2 to about 2,500, about 2 to about 1,000, about 100 to about 800, or from about 2 to about 100.

In embodiments, $R_1$ and $R_2$ are the same or different and are each independently selected from a long carbon side-chain containing from about 6 to about 30 carbon atoms, or from about 6 to about 20 carbon atoms, and R' or R" are the same or different and are each independently selected from a substituent containing from 0 to about 5 carbon atoms; or $R_1$ and $R_2$ are each independently selected from a substituent containing from 0 to about 5 carbon atoms, and R' is a long carbon side-chain containing from 6 to about 30 carbon atoms. In embodiments, $R_1$ and $R_2$, R', and R" are independently alkyl with about 1 to about 35 carbon atoms of, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl or octadecyl; or arylalkyl with about 7 to about 42 carbon atoms of, for example, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl. In another embodiment, $R_1$, $R_2$, R' and R" independently represent alkyl or substituted alkyl groups having from about 1 to about 35 carbon atoms.

In a specific embodiment, $R_1$, $R_2$, R', and R" are identical. In another specific embodiment, $R_1$, $R_2$, R' and R" are identical alkyl groups having from about 6 to about 18 carbon atoms.

In a specific embodiment, the semiconducting material is a compound of the formula

(1)

(2)

(3)

(4)

(5)

(6)

(7)

(8)

(9) and (10)

wherein n is an integer from 2 to about 5,000.

The number average molecular weight (Mn) of the polymers in embodiments can be, for example, from about 500 to about 400,000, including from about 1,000 to about 150,000, and the weight average molecular weight (Mw) thereof can be from about 600 to about 500,000, including from about 1,500 to about 200,000, both as measured by gel permeation chromatography using polystyrene standards.

In a specific embodiment, the semiconducting material is a compound of the formula (1). In another specific embodiment, the semiconducting material is a compound of the formula (2), (3), or (4).

The liquid vehicle can be any suitable or desired liquid vehicle. In embodiments, the liquid vehicle refers to a compound which is liquid at room temperature, normally, solvent. In embodiments, the liquid vehicle is an aromatic solvent. In further embodiments, the liquid vehicle is a halogenated aromatic solvent. Exemplary halogenated aromatic solvents include chlorobenzene, dichlorobenzene (1,2-dichlorobenzene, and 1,3-dichlorobenzene), trichlorobenzene, and chlorotoluene. In a specific embodiment, the liquid vehicle comprises 1,2-dichlorobenzene. In other embodiments, the liquid vehicle is a non-halogenated solvent. Exemplary non-halogenated aromatic solvents include toluene, xylene, mesitylene, trimethylbenezene, ethylbenzene, tetrahydronaphthalene, bicyclohexyl, and the like.

In certain embodiments, the liquid vehicle is a suitable solvent sufficient for dissolution of the solute, and the solute comprises a small molecule having a molecular weight that is less than about 1,000, and, optionally, the solute is an inorganic salt or pigment.

The process herein is scalable and enables a scale-up that is unlimited in volume. The process can be used to prepare product in an amount ranging from gram to tonne quantities (about 1,000 kilograms or about 2,205 pounds) or greater. In embodiments, a continuous scalable ink making process and formulation is described providing material property improvement resulting from use of an ultrasonic flow-through heat exchanger allowing production of unlimited quantities of high mobility small particle size polymer dispersion.

In embodiments, the product stream produced by the present continuous process comprises nanometer size particles in a dispersion wherein the particles have a Z-average particle size of from about 1 to about 1,000, or from about 10 to about 500, or from about 10 to about 300 nanometers, as measured with a Malvern Zeta Sizer® HT at room temperature (or about 21° C.).

In embodiments, the polymer particles have an average particle size of from about 1 to about 1000 nanometers (nm), such as from about 50 to about 500 nm, or about 100 to about 200 nm, or about 2 to about 20 nm. Herein, "average" particle size is typically represented as d50, or defined as the median particle size value at the 50th percentile of the particle size distribution, wherein 50% of the particles in the distribution are greater than the d50 particle size value, and the other 50% of the particles in the distribution are less than the d50 value. Average particle size can be measured by methods that use light scattering technology to infer particle size, such as Dynamic Light Scattering. The particle diameter refers to the length of the pigment particle as derived from images of the particles generated by Transmission Electron Microscopy.

In certain embodiments, the produce stream comprises nanometer size particles in a dispersion having a Z-average particle size of from about 1 to about 1,000 nanometers and a monomodal particle size distribution.

The polymer dispersions prepared herein can provide high mobility particles having a mobility of from about $10^{-3}$ to about 5 cm$^2$/Vsec, or from about $10^{-2}$ to about 5 cm$^2$/Vsec, or from about 0.2 to about 5 cm$^2$/Vsec. Thus, the process herein can provide full mobility potential material by a process that is scalable. Other processes are not practically scalable beyond 0.5 to 2 liters.

Previous processes have been difficult to filter and presented the need to frequently change filters indicating polymer retention on the filter therefore that the filtered dispersion is less rich in polymer and therefore has less mobility. Attempts to counteract this phenomenon include starting with a slightly more concentrated solution, but changing filters is a messy process and exposes the solution to air. The present process provides a fast pass through the filter (almost immediate without slowing) indicating little or no polymer retention and therefore the concentration before and after filtration are the same. Therefore, the present process improves the quality and yield of the ink as a larger fraction of the polymer is dispersed at the nano-scale and remains in the filtrate. In embodiments, the process herein provides from about 85 to about 95 percent, or from about 90 to about 99 percent nanometer size particle remaining in dispersion/as compared with about 85 percent remaining with previous processes.

The process herein can provide narrower particle size distributions over previous processes. In embodiments, the process herein provides a particle size distribution of from about 1 to about 1,000, or from about 10 to about 500, or from about 10 to about 300.

The process herein provides the only known viable production route to high volumes of semiconducting material ink, such as PQT-12 ink. The process herein provides a high dispersion quality, for example, narrower particle size distributions, a filtration that is easily performed, and results in the majority of PQT-12 polymer remaining in solution rather than being removed by the filter. For example, in embodiments, the present process results in from about 75 to about 90, or from about 80 to about 95, or from about 90 to about 99 percent of PQT-12 polymer remaining in solution.

Particle size distribution is a good indicator of improved dispersion quality. The process herein provides a process where the Particle Size Distribution (PSD) by intensity as measured by Malvern Instruments Zeta Sizer® HT is equal to or greater than 90% and secondary peak intensities of 6% and 5% compared to the control which has a primary peak intensity of about 50% and secondary peak intensities of about 45% and 4%. The Intensity PSD achieved with the present process is therefore almost monomodal compared to the bimodality seen in the control. In embodiments, the process herein provides a PQT-12 particle size distribution that has a primary peak intensity of from about 80% to 90% or from about 85% to 95% about or from about 90% to 99%.

In embodiments, the polymer solution can be prepared under inert atmosphere at the desired concentration in a heated stirring vessel at any suitable or desired temperature, such as from about 50° C. to about 110° C., or from about 50° C. to about 90° C., or from about 50° C. to about 80° C.

For example, the process can comprise heating PQT-12 polymer and a solvent to dissolution temperature in a vessel under inert atmosphere. In embodiments, heating comprises heating to a temperature of from about 45 to about 70° C., or from about 50° C. to about 110° C., or from about 50° C. to about 80° C.

The polymer solution can be heated in the dissolution vessel by any suitable or desired method. In embodiments, the solution was prepared in a 500 milliliter Pyrex® pressure jar with a screw top that allows the insertion of tubes for nitrogen and an outlet tube to the ultrasonic heat exchanger under nitrogen pressure. The solution is made by adding the solvent, PQT-12 polymer and Teflon® stir bar to the jar, closing the jar, and then heating with magnetic stirring in a water bath placed on a hot plate to dissolution.

In embodiments, the present process comprises controlling the cooling rate by employing various combinations of pressure, residence time, bath temperature, length and or composition of the tube, etc. The present continuous process is scalable and batch process are not because a high cooling rate can be obtained by the present process regardless of the total volume to be cooled as long as heat can be removed from the heat exchanger quickly enough so that the cooling rate is maintained at, in embodiments, greater than about 25° C./minute.

The polymer solution can then be directed from the heated dissolution vessel through a continuous flow vessel which is disposed in an ultrasonic heat exchanger, (cooled ultrasonic bath). The heated solution can be fed by any suitable or desired method, such as under pressure (or by pump), through the ultrasonic heat exchanger which is a continuous flow vessel that can have any suitable or desired configuration, such as a pipe, tube, or capillary, which is disposed in an ultrasonic heat exchanger, (cooled ultrasonic bath) at a controlled rate, in embodiments such that the cooling rate is faster than about 25° C./minute. In embodiments, the heated solution can be fed at a flow rate such that the cooling rate is from about 2,000° C./minute to about 25° C./minute, or from about 1,000° C./minute to about 200° C./minute, or from about 600° C./minute to about 300° C./minute.

In embodiments, the continuous flow vessel is a narrow diameter tube. As the polymer solution passes through the tube at a controlled rate and residence time, it is rapidly chilled under sonication to give nanometer size particle dispersion.

In embodiments, the heated polymer solution in the ultrasonic heat exchanger can be cooled to a temperature of from about 100° C. to about 0° C., or from about 80° C. to about 10° C., or from about 80° C. to about 20° C., in embodiments, over a time period of from about 4 minutes to about 0.05 minutes, or from about 3 minutes to about 0.07 minutes, or from about 2.5 minutes to about 0.07 minutes for about 200 grams of solution. In a specific embodiment, treating the heated polymer solution as the solution passes through the ultrasonic heat exchanger comprises treating with ultrasonication at a frequency of from about 20 kHz to about 10 MHz; and cooling the heated polymer solution in the ultrasonic heat exchanger to a temperature of from about 80 to about 30° C. at a rate of from about 300° C./minute to about 600° C./minute.

In embodiments, the ultrasonic heat exchanger provides treatment of the heated solution at a frequency of from about 20 kHz to about 10 Mhz; and a cooling device comprises a controlled temperature bath and provides cooling of the heated solution to a temperature of from about −30° C. to about 45° C.

As the polymer solution passes through the tube, which is suspended in the chilled ultrasonic bath (also referred to as an ultrasonic heat exchanger), the polymer solution quickly cools and precipitates nanometer-sized polymer particles due to the high ultrasound energy density. In this way, a high surface area is available to cool the solution through the walls of the tube while the solution is being subjected to ultrasonic energy. The solution flows through the tube without directly contacting the bath or ultrasonic device thereby avoiding adverse effects of direct contact on the equipment, the feed polymer solution, and the precipitate product solution stream.

The precipitated dispersion product stream can be collected in a receiver vessel under inert atmosphere and subsequently discharged to a pressure filter. The high quality of the ink produced enables the filtration to be undertaken using an in-line filtration process rather than a separate filtration process. In embodiments, the product stream can be filtered by in-line filtration of the product stream directly from the ultrasonic heat exchanger discharge end comprising and can, in embodiments, include one or more filtration passes.

The continuous flow vessel (for example, tube) can have any desired shape, size, or material characteristics. In embodiments, the continuous tube has a selected geometric configuration, diameter, length, or combination thereof, selected in order to achieve a desired volume, residence time, and feed rate of the heated polymer solution. For example, in embodiments, the tube may have a cylindrical geometric configuration, although not limited, and a diameter of from about 2 inches to about 1/16 inch, or from about 1 inch to about 1/16 inch, or from about 1/2 inch to about 1/16 inch for large scale continuous processes herein to prepare tonne product volumes. The flow rate in the tube is set as a function of diameter and bath temperature to ensure that the cooling rate is at a minimum 25° C./minute.

Further, the tube including the continuous flow-through passageway section, may comprise any suitable or desired geometrical configuration selected to enhance the sonication and cooling treatment.

The tube can comprise any suitable or desired material. In embodiments, the tube can be constructed from stainless steel, glass, polytetrafluoroethylene, or any material that is compatible with the material and solvents used.

The heated polymer solution can be treated with ultrasonication in any suitable or desired intensity and duration selected in accordance with the specific type and volume of nanodispersion being prepared. In embodiments, the heated polymer solution passes through the ultrasonic heat exchanger and is treated therein with ultrasonication at a frequency of from about 20 kHz to about 10 Mhz for a period of from about 10 seconds to about 20 minutes. In embodiments, the process includes treating the heated solution as the solution passes through the ultrasonic heat exchanger by treating with ultrasonication at a frequency of from about 20 kHz to about 10 Mhz; and cooling the heated solution in the ultrasonic heat exchanger to a temperature of from about −30° C. to about 45° C.

Further, the heated polymer solution can be cooled to any suitable or desired temperature selected in accordance with the specific type and volume of nanodispersion being prepared. In embodiments, the heated polymer dispersion is cooled in the ultrasonic heat exchanger to a temperature of from about 0° C. to about 10° C.

The ultrasonic heat exchanger can be cooled by any suitable or desired method, in embodiments, by ice water bath.

Further, the aforementioned properties improve the performance of the ink. For example, in embodiments, semi-conducting ink containing polymer nanodispersion prepared with the present process provide narrow PSD wherein about 95% of the particles have a PSD of 1 to 300 nanometers and is essentially monomodal (primary peak equal to or greater than 90%). This results in an ink that is very easy to filter and therefore has a high retention of polymer in the final ink solution (greater than 90% solids by moisture balance measurement).

Figure 2:
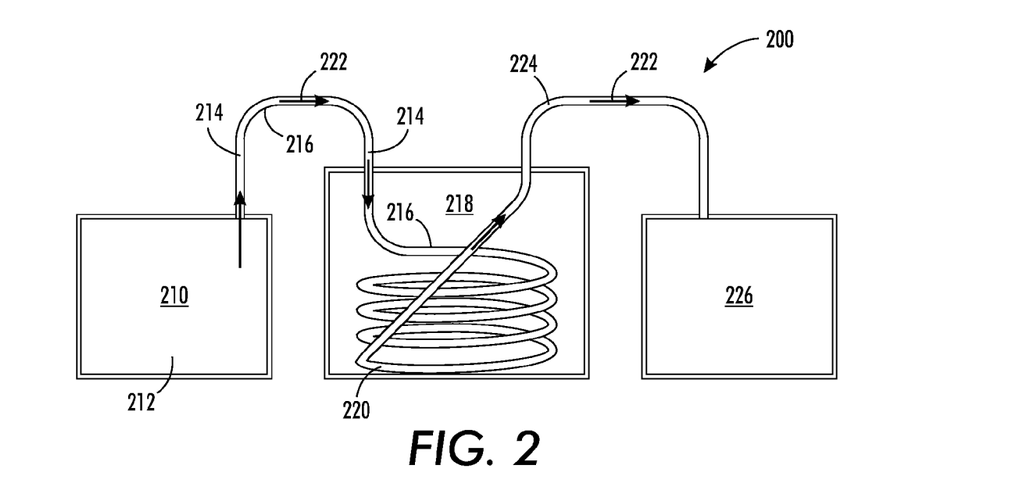
FIG. 2 is an illustration of a process for preparing polymer nanodispersions in accordance with the present disclosure.

Turning to FIG. 2, a system and process 200 for preparing polymer nanodispersions in accordance with the present disclosure includes a heated dissolution tank 210 containing a heated polymer solution 212 to be treated. Heated polymer solution 212 is fed from dissolution tank 210 through continuous tube 216 becoming heated polymer solution stream 214. Tube 216 is disposed in ultrasonic heat exchanger 218 (cooled ultrasonic bath) and forms a continuous flow-through passageway 220 for heated polymer stream 214 through ultrasonic heat exchanger 218. Polymer stream 214 passes through continuous flow-through passageway 220 disposed in ultrasonic heat exchanger 218 at a controlled rate and residence time and is rapidly chilled under sonication in the ultrasonic heat exchanger 218 forming product stream 222 comprising nanometer size particles in dispersion. Product stream 222 is flowed through continuous tube exit section 224, discharged and collected in receiving tank 226. Receiving tank 226 can be, in embodiments, a non-heated (that is, room temperature) holding tank for storing product stream 222 which can then be discharged to a receiver for later batch pressure filtration.

Figure 3:
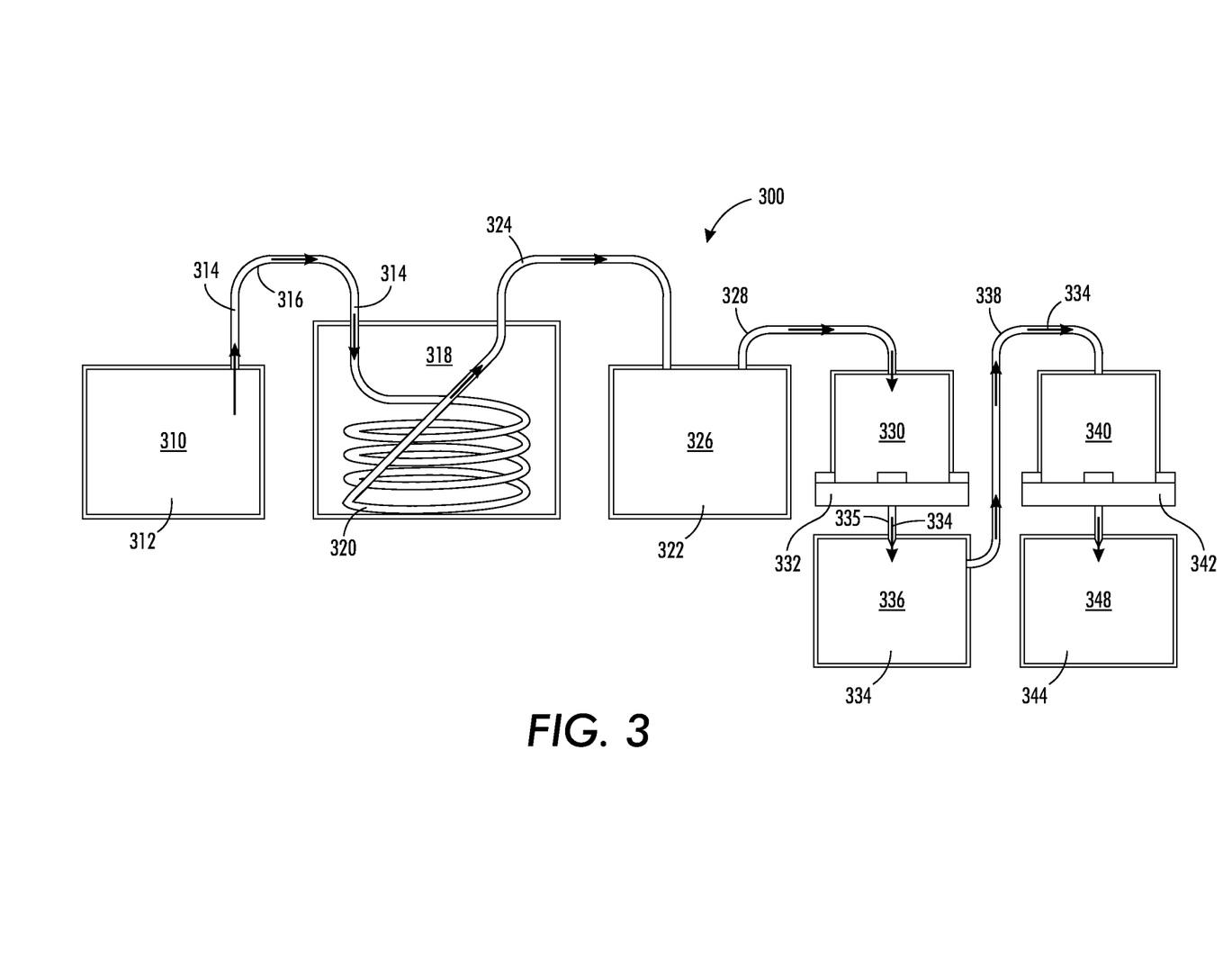
FIG. 3 is an illustration of an alternate process for preparing polymer nanodispersions in accordance with the present disclosure.

Turning to FIG. 3, in embodiments, a system and process 300 for preparing polymer nanodispersions in accordance with the present disclosure includes a heated dissolution tank 310 containing a heated polymer solution 312 to be treated. Heated polymer solution 312 is fed from dissolution tank 310 through continuous tube 316 becoming heated polymer solution stream 314. Tube 316 is disposed in ultrasonic heat exchanger 318 (cooled ultrasonic bath) and forms a continuous flow-through passageway 320 for heated polymer stream 314 to pass through and be treated in ultrasonic heat exchanger 318. Polymer stream 314 passes through continuous flow-through passageway 320 disposed in ultrasonic heat exchanger 318 at a controlled rate and residence time and is rapidly chilled under sonication in the ultrasonic heat exchanger 318 forming product stream 322 comprising nanometer size particles in dispersion. Product stream 322 is flowed through continuous tube exit section 324, and optionally discharged and collected in receiving tank 326. Receiving tank 326 can be, in embodiments, a non-heated (that is, room temperature) holding tank for storing product stream 322. Product stream 322 can further be discharged through tube 328 to filtration device 330 having filter 332, in embodiments, batch pressure filtration device 332, where product stream 322 is filtered providing filtered product stream 334 which is collected in filtered receiving tank 336. Optionally, filtered product stream 334 is treated in one or more additional filtration devices. In embodiments, filtered product stream 334 is discharged through tube 338 to filtration device 340 having filter 342 where filtered product stream 334 is filtered providing twice-filtered product stream 344 which is collected in filter receiving tank 348.

In embodiments, compositions prepared by the process herein can be printed, and the semiconducting composition may be referred to as an ink composition. In embodiments, semiconducting devices can be, for example, TFTs, diodes, photovoltaics, memory devices, and the like. In further embodiments, semiconducting devices are disclosed as TFTs comprising a substrate; a gate electrode; a gate dielectric layer; a source electrode; a drain electrode; and in contact with the source and drain electrodes and the gate dielectric layer, a semiconducting layer comprising the a semiconducting composition containing a polymer nanodispersion prepared by the present process. Semiconductor devices herein can comprise any suitable or desired configuration. See, for example, U. S. Patent Publication 20080102559, which is hereby incorporated by reference herein in its entirety, for a description of a suitable electronic device configuration.

For example, semiconductor devices herein can comprise organic thin-film transistors ("OTFT"s) having a first bottom-gate OTFT configuration. The OTFT can comprise a substrate in contact with a gate electrode and a dielectric layer. The gate electrode can be disposed within or outside of the substrate. However, the dielectric layer separates the gate electrode from the source electrode, drain electrode, and the semiconducting layer. The source and drain electrodes contact the semiconducting layer. The semiconducting layer can be disposed over and between the source and drain electrodes. An optional interfacial layer can be located between the dielectric layer and the semiconducting layer.

Alternately, second bottom-gate OTFT configuration can be used comprising a substrate in contact with a gate electrode and a dielectric layer. The semiconducting layer is placed over or on top of the dielectric layer and separates it from the source and drain electrodes. An optional interfacial layer can be located between the dielectric layer and the semiconducting layer.

Another possible OTFT configuration comprises a third bottom-gate configuration comprising a substrate which also acts as the gate electrode and is in contact with a dielectric layer. The semiconducting layer is placed over or on top of the dielectric layer and separates the dielectric layer from the source and drain electrodes. An optional interfacial layer can be located between the dielectric layer and the semiconducting layer.

Further, a top-gate OTFT configuration can be used comprising a substrate in contact with the source and drain electrode and the semiconducting layer. The semiconducting layer runs over and between the source and drain electrodes. The dielectric layer is on top of the semiconducting layer. The gate electrode is on top of the dielectric layer and does not contact the semiconducting layer. An optional interfacial layer can be located between the dielectric layer and the semiconducting layer.

The semiconducting layer may be formed from a semiconducting composition as disclosed herein which is suitable for use in forming a thin film transistor, including a top-gate thin film transistor. The semiconducting composition comprises a semiconducting material and a liquid vehicle prepared as described herein.

In embodiments, the process herein is a process that is easily isolated from ambient oxygen so that a device prepared with the product produced by the process has a high mobility, a high current on/off ratio, and a low off current. In embodiments, a high mobility means a mobility of from about 0.01 $cm^2/V.s$ to about 10 $cm^2/V.s$ or from about 0.05 $cm^2/V.s$ to about 1.5 $cm^2/V.s$, or a mobility greater than 0.05 $cm^2/V.s$. In embodiments, a high current on/off ratio means a current on/off ratio of greater than $10^5$, or greater than $10^6$. In embodiments, a low off current means an off current less than $10^{-9}$ A, or less than $10^{-10}$ A.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

Comparative Example 1

Figure 4:
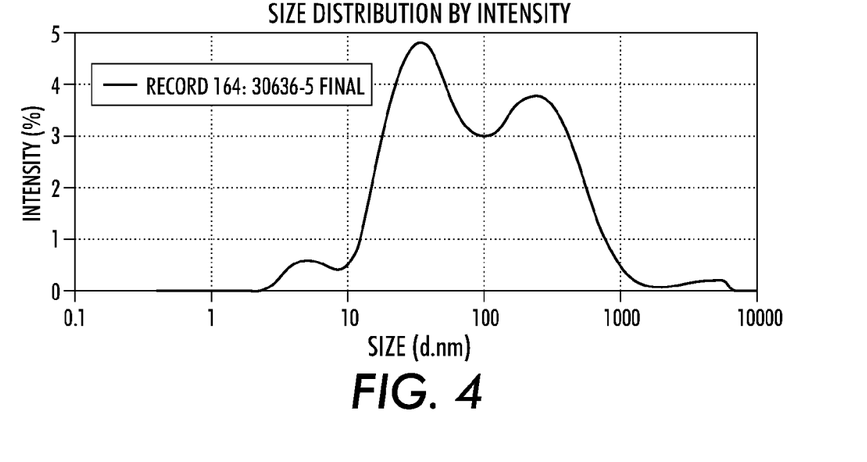
FIG. 4 is a graph illustrating particle size distribution of a comparative ink.

Batch Process. A 200 gram scale ink dispersion was prepared by the following method. In a 500 milliliter round bottom flask was added 199.4 grams of 1,2-dichlorobenzene and 0.6 grams of purified PQT-12 polymer (poly[5,5'-bis(3-dodecyl-2-thienyl)-2,2'-bithiophene). PQT-12 can be prepared by any suitable or desired method. In embodiments, PQT-12 can be prepared as described in U.S. Patent Publication 2010/0093129, published Apr. 13, 2010. Under $N_2$, this slurry was heated to 75° C. over 1 hour with magnetic stirring. At the end of 1 hour, the polymer was a solution appearing reddish orange brown in color. The flask was then immersed in a chilled (2° C.) ultrasonic bath and swirled to cool under sonication. After about 2 minutes, the color of the solution changed to dark purple as the polymer precipitated. The resulting cooling rate for this process was approximately 25° C./minute. The flask was further subjected to this treatment for a total of 10 minutes at which time it was filtered using a 500 milliliter stainless steel pressure filter fitted with glass fiber filter (GF/F) paper (0.7 micrometer). The resulting particle size distribution of the ink is shown in FIG. 4. After filtration the polymer dispersion was sent for testing.

Example 2

Figure 5:
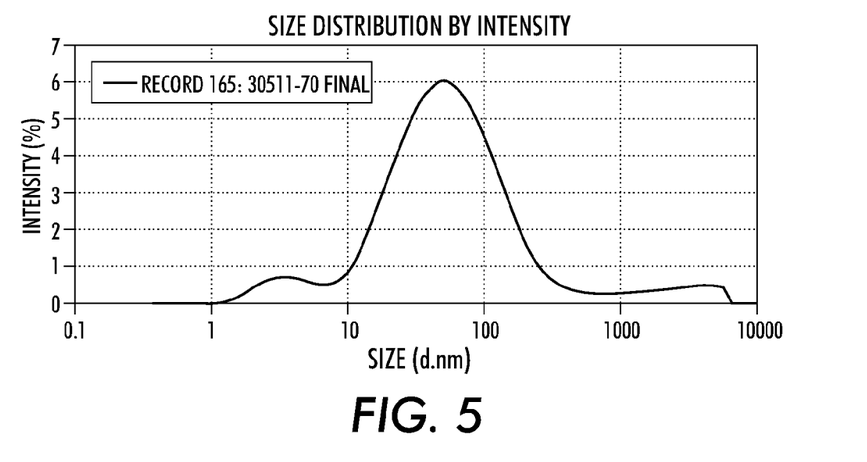
FIG. 5 is a graph illustrating particle size distribution of an ink prepared in accordance with the present disclosure.
Figure 6:
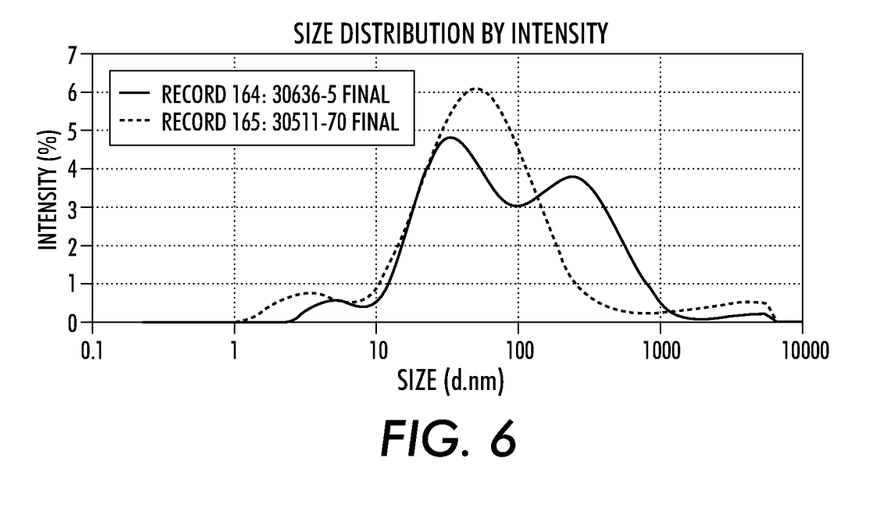
FIG. 6 is a graph illustrating particle size monomodality for a polymer dispersion prepared in accordance with the present disclosure versus particle size bimodality for a polymer dispersion prepared in accordance with a comparative batch process.

Continuous Process. A 200 gram scale ink dispersion was prepared by the following method. Into a 250 milliliter gas-tight bottle was loaded 0.6 gram of purified PQT-12 polymer and 199.4 grams of 1,2-dichlorobenzene. This feed bottle was heated to 80° C. using a preheated thermostat oil bath. The solution was stirred using a magnetic stir bar operating at 250 revolutions per minute. An argon supply line and outlet solution line were connected to the feed tank to permit pressurization of the feed tank and subsequent conveying of the solution through the solution exit line. All lines were constructed of ⅛" polytetrafluoroethylene (PTFE) tubing. The solution supply line, 24 centimeters in length, was connected to a heat exchange section of tubing (⅛" PTFE, 90 centimeters long) immersed in an ultrasound bath maintained at 0° C. with ice. The exit of this tubing section (ultrasound heat-exchanger) was connected to a three way valve through 36 centimeters of ⅛" PTFE tubing. The three way valve directs the flow to a receiving flask during operation or to waste for cleaning and start-up purposes. The receiving vial was positioned on a load cell to permit monitoring of the solution flow rate during the process. The system and process is illustrated in FIGS. 2 and 3 described above. The process was started by opening the three way valve to permit solution flow from the feed flask to the receiving flask under the administered argon pressure. As the orange feed solution entered the heat exchanger section, at a rate of 6.25 grams/minute, it was cooled by the ice water in the ultrasonicator causing the PQT-12 to precipitate and form a homogeneous purple solution. The cooling rate under this configuration was approximately 410° C./minute. The ultrasonication administered in the bath lead to the formation of very small (32 nanometer) PQT-12 particles with a narrow particles size distribution. The production run was completed in 32 minutes. The solution in the receiving flask was then filtered using a 500 milliliter stainless steel pressure filter fitted with GF/F filter paper (0.7 micrometer). As compared to prior art batch process, the solution filtered easily. The resulting particle size distribution of the ink is shown in FIG. 5. After filtration the polymer dispersion was sent for testing.

Table 1 summarizes analytical results measurements for the inks produced in the examples above and the resulting performance of devices made therefrom.

TABLE 1

Analytical and Mobility Data of Examples

| Example | Scale (grams) | Particle Size (Z-average, nanometers) | Solids % | Surface Tension (milliNewtons/meter) | Viscosity (centipoise) | Notes | Average Mobility ($cm^2/V \cdot s$) |
|---|---|---|---|---|---|---|---|
| Comparative Example 1 | 200 | 48 | 0.26 | 34.4 | 4.8 | Unscalable lab batch immersion process | 0.13 |

TABLE 1-continued

Analytical and Mobility Data of Examples

| Example | Scale (grams) | Particle Size (Z-average, nanometers) | Solids % | Surface Tension (milliNewtons/meter) | Viscosity (centipoise) | Notes | Average Mobility (cm$^2$/V · s) |
|---|---|---|---|---|---|---|---|
| Example 2 | 200 | 32 | 0.27 | 35.7 | 4.8 | Continuous process for preparing - ink jettable polymer nanodispersion using an ultrasonic flow-through heat exchanger | 0.13 |

Referring to Table 1, it can be see that the % solids of each process are very close, but the process herein is slightly better. For example, in embodiments, the present process can provide a concentration at dissolution of 0.3, while previous processes provided 0.26% solids after filtration. In embodiments, the present process can provide 0.27% solids after filtration. While some process loss is unavoidable, the present process provides as little difference as possible between the dissolution concentration and the concentration of the final filtered ink.

Example 3

Thin-Film Transistor Fabrication and Characterization. A top-contact thin film transistor structure was chosen as the primary test device configuration. The test device was comprised of an n-doped silicon wafer with a thermally grown silicon oxide layer of a thickness of about 200 nanometers thereon. The wafer functioned as the gate electrode while the silicon oxide layer acted as the insulating layer and had a capacitance of about 15 nF/cm$^2$ (nanofarads/square centimeter). The fabrication of the device was accomplished under ambient conditions without any precautions being taken to exclude the materials and device from exposure to ambient oxygen, moisture, or light. The silicon wafer was first cleaned with argon plasma, isopropanol, air dried, and then immersed in a 0.1 M solution of octyltrichlorosilane in toluene for about 20 minutes at room temperature. Subsequently, the wafer was washed with toluene, isopropanol and air-dried. The above PQT-12 dispersions from both batch (Comparative Example 1) and continuous (Example 2) processes were spin coated on the modified silicon wafer at 1000 rpm for 120 seconds, resulting in a very homogenous semiconductor polythiophene layer of about 30 nanometers in thickness. After being dried and annealed in vacuo at 80 to 140° C., gold electrodes were vacuum evaporated on top of the semiconductor layer through a shadow mask to complete the devices.

The evaluation of field-effect transistor performance was accomplished in a black box at ambient conditions using a Keithley 4200 SCS semiconductor characterization system. The carrier mobility, μ, was calculated from the data in the saturated regime (gate voltage, VG <source-drain voltage, VSD) accordingly to equation (1)

$$I_{SD} = C_i \mu (W/2L)(V_G - V_T)^2 \quad (1)$$

where $I_{SD}$ is the drain current at the saturated regime, W and L are, respectively, the semiconductor channel width and length, $C_i$ is the capacitance per unit area of the insulating layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

Transistors with dimensions of W (width)=5,000 μm and L (length)=90 μm were measured. Both field-effect mobility and current on/off ratio were summarized as the following:

TABLE 2

| Sample | Average Mobility (cm$^2$/V · s) | Current on/off ratio |
|---|---|---|
| Comparative Example | 0.13 | 10$^5$ |
| Example 1 | 0.13 | 10$^5$-10$^6$ |

The PQT-12 dispersion generated from the continuous process showed the same field effect mobility as the control batch process, but higher current on/off ratio. This revealed a benefit of the present continuous process, which minimized exposure of the semiconducting polymer to ambient oxygen, thus preventing from any potential oxygen doping that causes low on/off ratio.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A continuous process for preparing nanodispersions comprising:
    providing a composition including a liquid and a solute;
    heating the composition to dissolution of the solute to form a solution including the solute dissolved in the liquid;
    directing the heated solution through a continuous tube, the continuous tube having a first end for receiving the solution, a continuous flow-through passageway disposed in an ultrasonic heat exchanger, and a second end for discharging a product stream; and
    treating with ultrasonication the heated solution as the solution passes through the continuous flow-through passageway disposed in the ultrasonic heat exchanger to form the product stream including nanometer size particles in the liquid.

2. The continuous process of claim 1, wherein the solute includes a conjugated polymer.

3. The continuous process of claim 1, wherein the solute comprises:
a semiconducting material including a compound of the formula (I)

wherein A is a divalent linkage;
R$_1$ and R$_2$ are each independently selected from the group consisting of hydrogen, alkyl, substituted alkyl, alkoxy, substituted alkoxy, a suitable hetero-containing group, a halogen, perhaloalkyl, alkoxyalkyl, siloxyl-substituted alkyl, and polyether;
n is an integer from about 2 to about 5,000;
the divalent linkage A is selected from the group consisting of

-continued

-continued or a combination thereof; and
each R' and R" is independently selected from the group consisting of hydrogen, alkyl, substituted alkyl, aryl, substituted aryl, heteroaryl, halogen, —CN, and —NO$_2$.

4. The continuous process of claim 1, wherein the heating the composition heats the composition to a temperature from about 50° C. to about 110° C.

5. The continuous process of claim 1, wherein the directing the heated solution directs the heated solution through the continuous tube at a controlled rate.

6. The continuous process of claim 1, wherein the continuous tube has a selected geometric configuration, diameter, length, or combination thereof, selected in order to achieve a desired volume, residence time, and feed rate of the heated solution.

7. The continuous process of claim 1, wherein the treating the heated solution comprises:
treating with ultrasonication at a frequency from about 20 kHz to about 10 Mhz; and
cooling the heated solution in the ultrasonic heat exchanger to a temperature from about −30° C. to about 45° C.

8. The continuous process of claim 1, further comprising:
collecting the product stream in a product receiving vessel; and
filtering the product stream.

9. The continuous process of claim 8, wherein the product stream comprises the nanometer size particles in a dispersion having a Z-average particle size from about 1 to about 1,000 nanometers and a monomodal particle size distribution.

10. The continuous process of claim 1, wherein the process is isolated from ambient oxygen so that a device prepared with the product stream has a higher mobility, a higher current on/off ratio, and a lower off current.

11. The continuous process of claim 8, wherein the filtering the product stream comprises in-line filtration of the product stream directly from the ultrasonic heat exchanger discharge end.

* * * * *